(12) United States Patent
Ke et al.

(10) Patent No.: US 7,098,119 B2
(45) Date of Patent: Aug. 29, 2006

(54) THERMAL ANNEAL PROCESS FOR STRAINED-SI DEVICES

(75) Inventors: Chung-Hu Ke, Taipei (TW); Wen-Chin Lee, Hsinchu (TW); Chenming Hu, Almo, CA (US)

(73) Assignee: Taiwan Semiconductor Manufacturing Co. Ltd., (TW)

( * ) Notice: Subject to any disclaimer, the term of this patent is extended or adjusted under 35 U.S.C. 154(b) by 72 days.

(21) Appl. No.: 10/845,374

(22) Filed: May 13, 2004

(65) Prior Publication Data

US 2005/0253166 A1 Nov. 17, 2005

(51) Int. Cl.
*H01L 29/06* (2006.01)
(52) U.S. Cl. ............... 438/478; 438/502; 438/509; 438/514
(58) Field of Classification Search ............... None
See application file for complete search history.

(56) References Cited

U.S. PATENT DOCUMENTS

| 4,830,983 A | 5/1989 | Thornton |
| 6,599,781 B1 | 7/2003 | Li |

OTHER PUBLICATIONS

Eguchi, S., et al., "Diffusion Behavior of Ion-Implanted n-type Dopants in Silicon Germanium", Mat. Res. Soc. Symp. Proc., vol. 686, Materials Research Society, pp. 33-38 (2002).
Ghani, T., et al., "Scaling Challenges and Device Design Requirements for High Performance Sub-50 nm Gate Length *Planar* CMOS Transistors", Symp. VLSI Tech. Dig., (2000).
Ito, T., et al., "Improvement of Threshold Voltage Roll-off by Ultra-shallow Junction Formed by Flash Lamp Annealing", Symp. VLSI Tech. Dig., pp. 53-54 (2003).
Maiti, C.K., et al., "Applications of Silicon-Germanium Heterostructure", Institute of Physics Publishing pp. i-31 (2000).
Yu, Bin, et al., "70 nm MOSFET with Ultra-Shallow, Abrupt, and Super-Doped S/D Extension Implemented by Laser Thermal Process (LTP)", IEDM Tech. Digest 99, pp. 509-512 (1999).

*Primary Examiner*—Fetsum Abraham
(74) *Attorney, Agent, or Firm*—Duane Morris LLP

(57) ABSTRACT

A method is disclosed for forming a semiconductor device using strained silicon. After forming a first substrate material with a first natural lattice constant on a device substrate and a second substrate material with a second natural lattice constant on the first substrate material, a channel, source and drain regions of a field effective transistor are further defined using the first and second substrate materials. After implanting one or more impurity materials to the source and drain regions, and the transistor goes through an annealing process using a high speed heat source other than a Tungsten-Halogen lamp.

24 Claims, 5 Drawing Sheets

| Process Time (sec) | | |
|---|---|---|
| Laser Anneal | Noble Gas Arc | Tungsten-Halogen |
| 5.00E-08 | 8.00E-04 | 4 |

FIG. 3

THERMAL ANNEAL PROCESS FOR STRAINED-SI DEVICES

BACKGROUND

The present invention relates generally to semiconductor devices, and more particularly to a method to improve carrier mobility, through the incorporation of strained silicon, in semiconductor devices.

Metal-Oxide-Semiconductor field effect transistors (MOSFETs) are a common component of integrated circuits (ICs). By continually reducing the gate oxide thickness, and the length of the gate electrode, the semiconductor industry has doubled the transistor's switching speed every eighteen to twenty-four months, a phenomenon popularly known as the Moore's Law. The strategy of shrinking both the gate oxide thickness, and the source drain length, has allowed the Moore's Law to uphold in the past, but the technology market's insatiable desire for increasing switching speed is causing the strategy to reach its limits. Newer strategies, such as switching to new materials for the transistor's substrate, and the incorporation of new process methods to effectively use these new materials, are, therefore, designed and applied.

One such strategy for increasing the performance of MOSFETs is to enhance the carrier mobility of silicon (Si), thereby reducing resistance and power consumption, and increasing drive current, frequency response and operating speed. A method of enhancing carrier mobility that has become a focus of recent attention is the use of silicon material to which a tensile strain is applied. "Strained" silicon, or strained-Si, may be formed by growing a layer of silicon on a silicon germanium (SiGe) substrate or base. The silicon germanium lattice is generally more widely spaced than a pure silicon lattice as a result of the presence of the larger germanium atoms in the lattice. Because the atoms of the silicon lattice align with the more widely spread silicon germanium lattice, a tensile strain is created in the silicon layer. In other words, the silicon atoms are essentially pulled apart from one another. The amount of tensile strain applied to the silicon lattice increases with the proportion of germanium in the silicon germanium lattice.

Relaxed silicon has six equal valence bands. The application of tensile strain to the silicon lattice causes four of the valence bands to increase in energy and two of the valence bands to decrease in energy. As a result of quantum effects, electrons effectively weigh 30 percent less when passing through the lower energy bands. Thus the lower energy bands offer less resistance to electron flow. In addition, electrons encounter less vibrational energy from the nucleus of the silicon atom, thereby causing them to scatter at a rate of 500 to 1,000 times less than in relaxed silicon. As a result, carrier mobility is dramatically increased in strained silicon as compared to relaxed silicon, thereby offering a potential increase in mobility of 80 percent or more for electrons and 20 percent or more for holes. The increase in mobility has been found to persist for current fields of up to 1.5 megavolts/centimeter. These factors are believed to enable a device speed increase of 35 percent without further reduction of device size, or a 25 percent reduction in power consumption without a reduction in performance.

The abruptness of the source and drain extensions is critical in strained-Si technology. One difficulty is that dopants are observed to diffuse faster in strained-Si than in Si, thereby causing drain extensions to move further under the gate and increasing gate-to-drain capacitance. Also, the diffusion of germanium across the SiGe-to-silicon boundary will release stress and reduce mobility in the strained Si layer.

In further consideration, the junction depth for source and drains should be only 35–75 nm deep for the 100 nm generation of devices to go into production in the near future, while drain extensions should only be less than 20–35 nm deep.

Therefore, desirable in the art of semiconductor designs are additional designs that may reduce the implant energy and annealing time, thereby achieving higher carrier mobility as well as shallower junctions.

SUMMARY

In view of the foregoing, this invention provides an advanced thermal annealing process for forming strained-Si devices.

In one embodiment, a method is disclosed for forming a semiconductor device using strained silicon. After forming a first substrate material, with a first natural lattice constant on a device substrate, and a second substrate material with a second natural lattice constant, on the first substrate material, channel, source and drain regions of a field effective transistor are further defined using the first and second substrate materials. After implanting one or more impurity materials to the source and drain regions, and the transistor goes through an annealing process using a high speed heat source other than a Tungsten-Halogen lamp.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 3 tabulates the heat pulse times of various heat sources.

DESCRIPTION

The present invention provides various design embodiments to demonstrate the effects of incorporating a strained channel and an advanced thermal annealing process to improve transistor performance.

Figure 1:
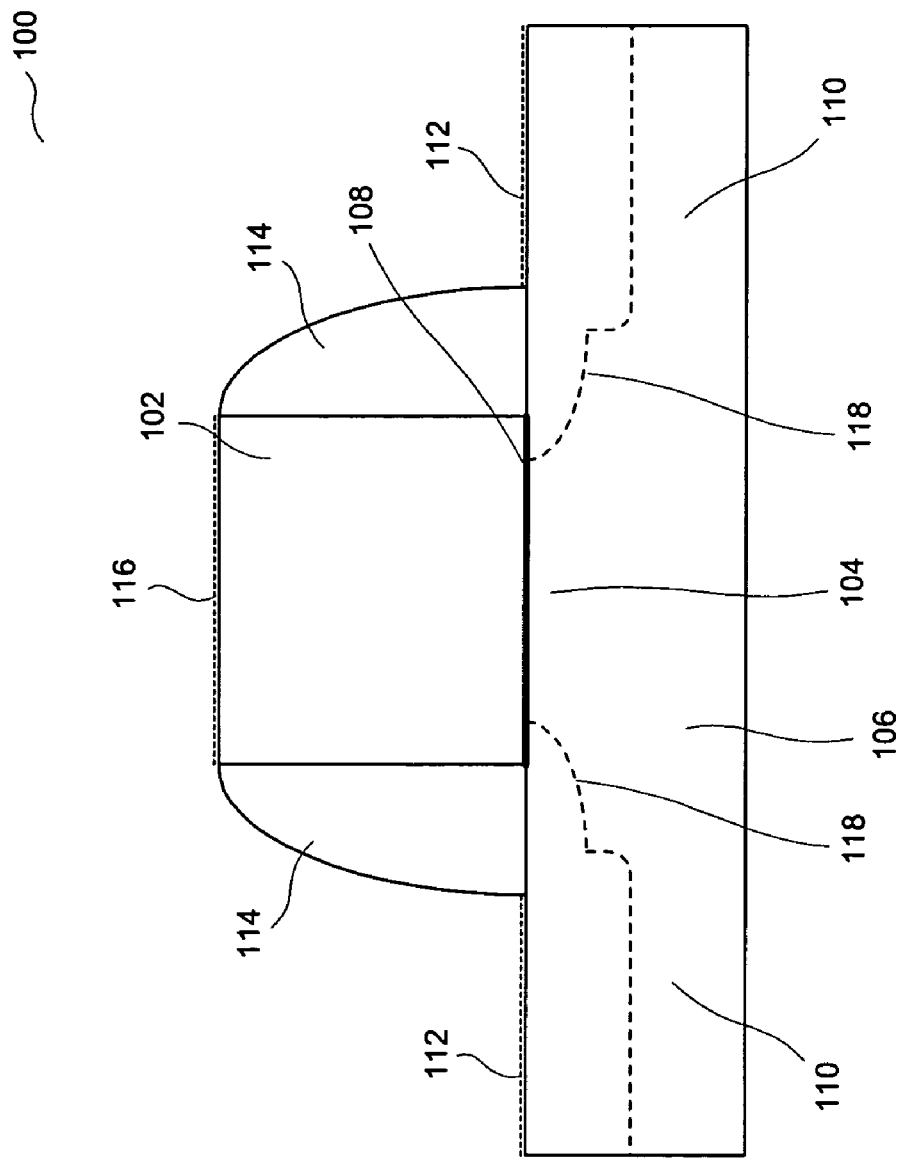
FIG. 1 illustrates a cross-sectional drawing of a conventional MOSFET.

FIG. 1 illustrates a cross-sectional drawing 100 of a conventional MOSFET. The MOSFET includes a gate electrode 102 that is separated from a channel region 104 in the substrate 106 by a thin first gate insulator 108, such as silicon oxide or oxide-nitride-oxide (ONO). The gate electrode 102 is typically formed from a doped semiconductor material such as polysilicon.

The source and drain of the MOSFET are formed on opposing sides of the gate electrode 102 as deep source and drain regions 110. Source and drain silicide contacts 112 are formed on the source and drain regions 110. These silicides typically include a compound comprising the substrate semiconductor material and a metal such as cobalt (Co), nickel (Ni) or titanium (Ti) used to reduce contact resistance to the source and drain regions 110. The source and drain regions 110 are formed deep enough to extend beyond the depth to which the source and drain silicide contacts 112 are formed. The source and drain regions 110 are implanted only after the formation of spacers 114 around the gate electrode 102. The spacers 114 serve as an implantation mask to define the lateral position of the source and drain regions 110 relative to the channel region 104 beneath the gate.

The gate electrode 102, likewise, has a silicide gate contact 116 formed on its upper surface. The gate structure comprising a polysilicon material and an overlying silicide is sometimes referred to as a polycide gate.

The source and drain of the MOSFET further includes shallow source and drain extensions 118. As dimensions of the MOSFET are reduced, short channel effects resulting from the small distance between the source and drain cause a degradation of MOSFET performance. The use of shallow source and drain extensions 118, rather than the deep source and drain regions near the ends of the channel 104, help to reduce short channel effects and excessive device element capacitances. The shallow source and drain extensions are implanted prior to the formation of the spacers 114. Diffusion, during subsequent annealing causes the source and drain extensions 118 to extend slightly beneath the gate electrode 102.

Figure 2:
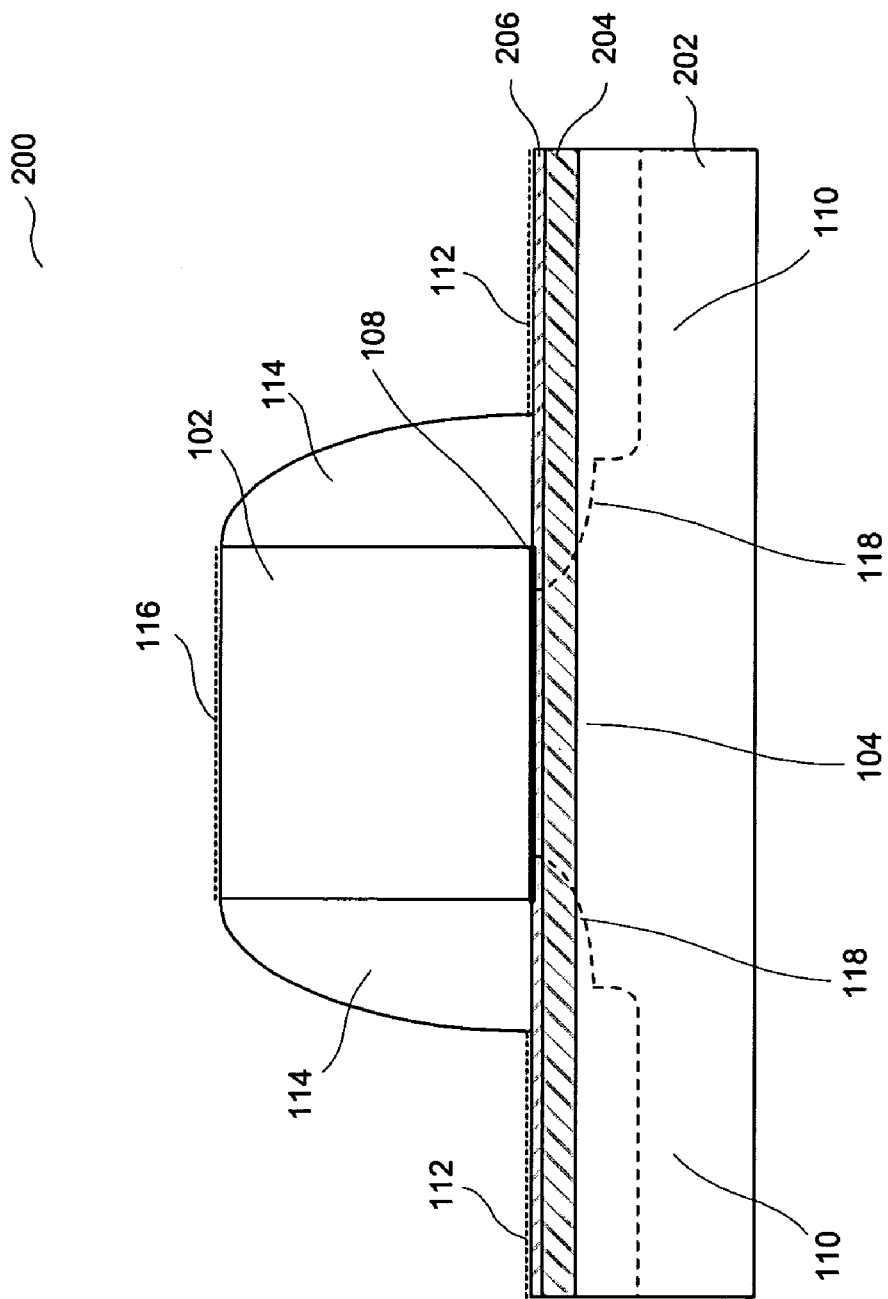
FIG. 2 illustrates a cross-sectional drawing of a MOSFET fabricated with two layers of substrates, in accordance with a first embodiment of the present invention.

FIG. 2 illustrates a cross-sectional view 200 of a MOSFET fabricated with two layers of substrates in accordance with a first embodiment of the present invention. The MOSFET structure is formed on a substrate 202, typically silicon. On top of the substrate 202 is a silicon germanium layer 204, further on which is formed an epitaxial layer of strained silicon 206. The natural lattice constants of the silicon germanium layer 204 and the silicon layer 206 are different. The MOSFET uses other conventional MOSFET structures, including the deep source and drain regions 110, the shallow source and drain extensions 118, the gate oxide layer 108, the gate electrode 102 surrounded by spacers 114, silicide source and drain contacts 112, and the silicide gate contact 116. The channel region 104 of the MOSFET includes the strained silicon material which provides enhanced carrier mobility between the source and drain. It is understood that the channel lattice distance may be bigger than five angstroms due to the strained silicon arrangement.

After the introduction of dopant impurities, typically by implant, annealing is performed to activate the implants. The use of a fast heat source such as a noble gas lamp is herein proposed as an improved method for performing this annealing over the typically used Tungsten-Halogen lamp. Such a heat source shall be able to provide a heat ramp-up rate of 250 degrees Celsius per second. While in the annealing process, a peak temperature time should be controlled so that no overheating is caused. Typically, for the recommended heat sources described in more details below, no more than 10 ms of the peak temperature time is required.

In a first suggested embodiment, this type of heat lamp may be a DC water-wall argon lamp or an AC xenon lamp. These types of lamps provide flash times as low as 0.8 ms, and as high as 1.5 ms. In addition, the wavelength of the xenon lamp is typically between 1.4 and 5 um. The use of these types of lamps allows the annealing of the semiconductor without causing excessive germanium diffusion, which reduces channel mobility. In addition, the use of these sources may reduce the diffusion of impurities under the gate and the relaxation of the strained-Si layer caused by diffusion of germanium into the strained layer. In the first suggested embodiment, the use of any one of the proposed high speed heat sources may produce MOSFETs, as shown in FIG. 2, with junction abruptness of less than 10 nm per decade drop of doping concentration.

In another suggested embodiment, an XeCl excimer laser may be used as an annealing heat source. The heat pulse time of an excimer laser provides the shortest pulse time of 90 ns. A Table 300 of the heat pulse times of various heat sources is presented in FIG. 3.

Figure 4:
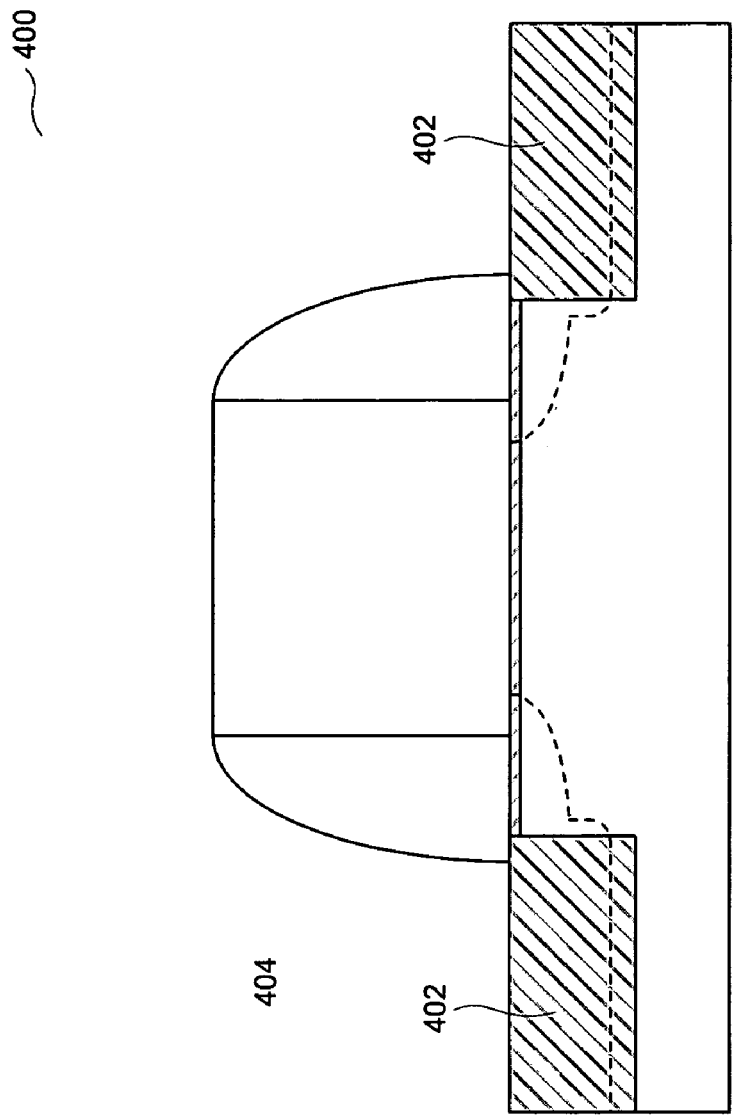
FIG. 4 illustrates a cross-sectional drawing of a MOSFET fabricated with a second semiconductor material in the source-drain regions in accordance with a second embodiment of the present invention.

FIG. 4 illustrates a cross-sectional drawing 400 of a MOSFET according to another embodiment of the present invention. In this embodiment, the source and drain regions 402 at the opposing sides of the gate may have different lattice constants due to different material combinations. Further, the MOSFET structure may have the same structure as the one illustrated in FIG. 2, but may also have a strained-Si layer 404 only in the channel regions. The formation of different materials in the source or drain region can be done through conventional photo masking and etching techniques. For embodiment, a portion of the source or drain region containing the compound semiconductor, typically SiGe, can be removed. Then, semiconductor material is deposited to form the source or drain region. When the lattice constants of the materials in the source and drain regions are different, the anneal process ad described can be used for a better resulting product. One of the improved anneal heat sources, as tabulated in the Table 300, may be used in the fabrication of this type of device, which may have a junction abruptness of less than 10 nm per decade drop of doping concentration. The same device improvements of minimal germanium and implanted impurity diffusion may then be realized.

Figure 5:
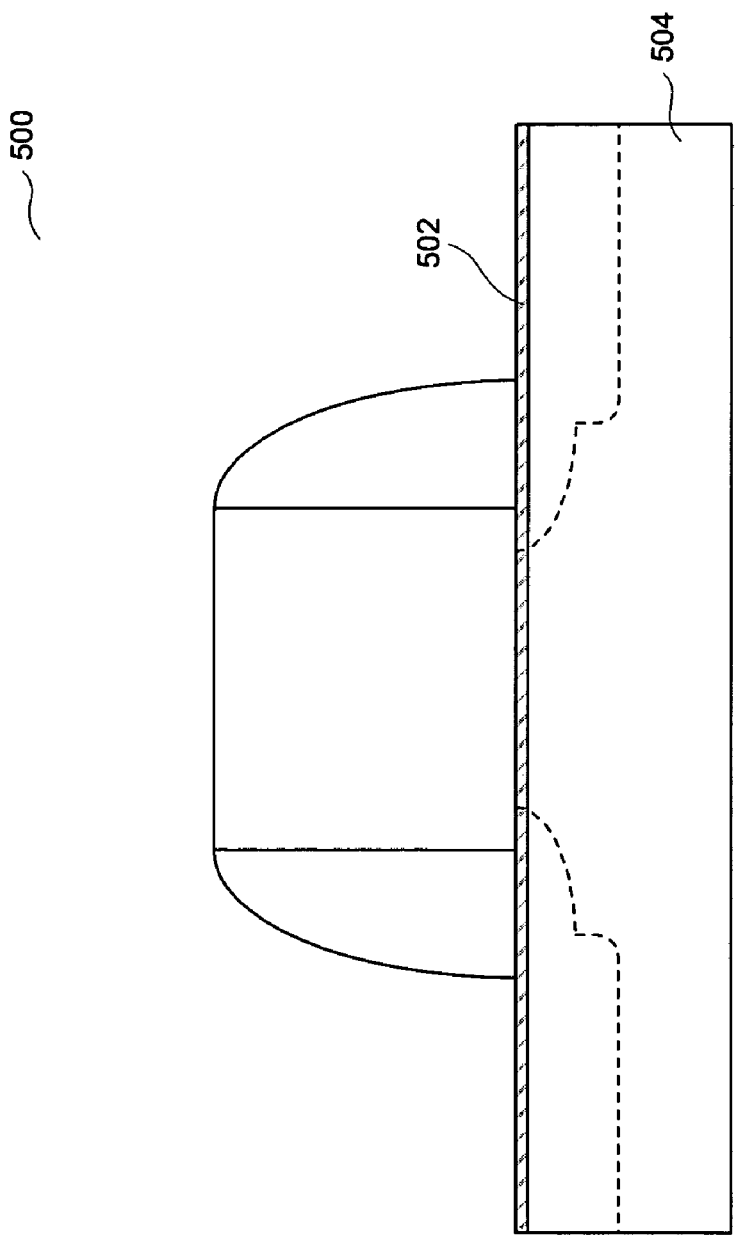
FIG. 5 illustrates a cross-sectional drawing of a MOSFET fabricated with one layer of substrate in accordance with a third embodiment of the present invention.

FIG. 5 illustrates a cross-sectional drawing 500 of a MOSFET fabricated with one layer of substrate in accordance with a third embodiment of the present invention. A strained-Si layer 502 is formed on a substrate layer 504, typically SiGe. Alternatively, such a device may be fabricated in the substrate layer 504 with a channel lattice distance greater than 5.43 Angstroms. One of the improved anneal heat sources, as tabulated in the Table 300, may be used in the fabrication of this type of device, which may have a junction abruptness of less than 10 nm per decade drop of doping concentration.

The above invention provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in a design and method for forming strained silicon devices, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for forming a semiconductor device using strained silicon, the method comprising:

forming a first substrate material with a first natural lattice constant on a device substrate;

forming a second substrate material with a second natural lattice constant on the first substrate material;

defining a channel, source and drain regions of a field effective transistor using the first and second substrate materials;

implanting one or more impurity materials to the source and drain regions; and annealing the transistor using a high speed heat source other than a Tungsten-Halogen lamp, wherein the channel has a channel lattice distance more than about five angstroms.

2. The method of claim 1 wherein the heat source is a noble gas lamp.

3. The method of claim 2 wherein the heat source is a DC water-wall argon lamp.

4. The method of claim 2 wherein the heat source is an AC xenon lamp.

5. The method of claim 4 wherein the xenon lamp has a wavelength between 1.4 um to 5 um.

6. The method of claim 1 wherein the heat source is a XeCl excimer laser.

7. The method of claim 1 wherein the annealing provides a junction abruptness of less than 10 nm per decade drop for a doping concentration of the impurity materials.

8. The method of claim 1 wherein a predetermined peak temperature time for the annealing is no longer than 10 ms.

9. The method of claim 1 wherein the annealing provides a heat ramp-up rate no slower than 250 degrees Celsius per second.

10. The method of claim 1 wherein the first substrate material is silicon germanium.

11. The method of claim 1 wherein the second substrate material is an epitaxial strained silicon.

12. The method of claim 1 wherein the channel region is formed in the second substrate material only.

13. The method of claim 1 wherein the source and drain regions have different lattice constants.

14. The method of claim 1 wherein the source and drain regions have different lattice constants.

15. The method of claim 1 wherein the channel has a channel lattice distance more than about five angstroms.

16. A method for forming a semiconductor device using strained silicon, the method comprising:

defining a channel, source and drain regions of a field effective transistor using a strained silicon substrate having a first and second substrate materials having different lattice constants;

implanting one or more impurity materials to the source and drain regions; and annealing the transistor using a high speed heat source other than a Tungsten-Halogen lamp, wherein the annealing provides a junction abruptness of less than 10 nm per decade drop for a doping concentration of the impurity materials.

17. The method of claim 16 wherein the heat source is a noble gas lamp.

18. The method of claim 17 wherein the heat source is a DC water-wall argon lamp.

19. The method of claim 17 wherein the heat source is an AC xenon lamp having a wavelength between 1.4 um to 5 um.

20. The method of claim 16 wherein the heat source is a XeCl excimer laser.

21. The method of claim 16 wherein a predetermined peak temperature time for the annealing is no longer than 10 ms.

22. The method of claim 21 wherein the annealing provides a heat ramp-up rate no slower than 250 degrees Celsius per second.

23. The method of claim 16 wherein the first substrate material is silicon germanium.

24. The method of claim 16 wherein the second substrate material is an epitaxial strained silicon.

* * * * *